US 6,993,832 B2

(12) United States Patent
Yamauchi (10) Patent No.: US 6,993,832 B2
(45) Date of Patent: Feb. 7, 2006

(54) CHIP MOUNTING DEVICE (75) Inventor: Akira Yamauchi, Shiga (JP)

(73) Assignee: Toray Engineering Co., Ltd., Osaka (JP)

( * ) Notice: Subject to any disclaimer, the term of this patent is extended or adjusted under 35 U.S.C. 154(b) by 165 days.

(21) Appl. No.: 10/469,299

(22) PCT Filed: Feb. 28, 2002

(86) PCT No.: PCT/JP02/01890

§ 371 (c)(1),
(2), (4) Date: Aug. 29, 2003

(87) PCT Pub. No.: WO02/071470

PCT Pub. Date: Sep. 12, 2002

(65) Prior Publication Data

US 2004/0082111 A1  Apr. 29, 2004

(30) Foreign Application Priority Data

Mar. 2, 2001 (JP) ............................... 2001-58210

(51) Int. Cl.
*B23P 19/00* (2006.01)
(52) U.S. Cl. ......................... 29/740; 29/564; 29/720; 29/721; 29/739
(58) Field of Classification Search ................. 29/740, 29/739, 721, 720, 564; 228/180.1, 180.21, 228/180.22
See application file for complete search history.

(56) References Cited

U.S. PATENT DOCUMENTS

| 5,249,349 A | * | 10/1993 | Kuinose et al. ............... 29/721 |
| 5,681,757 A | * | 10/1997 | Hayes ......................... 257/778 |
| 5,854,745 A |   | 12/1998 | Muraoka et al. |
| 5,938,874 A | * | 8/1999 | Palomo et al. ............. 156/73.1 |
| 6,193,136 B1 | * | 2/2001 | Higashi et al. ............. 228/106 |
| 6,286,202 B1 | * | 9/2001 | Asai et al. ..................... 29/740 |
| 6,317,972 B1 | * | 11/2001 | Asai et al. ..................... 29/833 |
| 6,643,921 B2 | * | 11/2003 | Asai et al. ..................... 29/833 |
| 6,807,725 B2 | * | 10/2004 | Asai et al. ..................... 29/740 |

FOREIGN PATENT DOCUMENTS

| JP | 08-114844 A1 | 5/1996 |
| JP | 2001-320196 A1 | 11/2001 |

(Continued)

OTHER PUBLICATIONS

International Preliminary Examination Report for PCT/JP02/01890 completed on May 6, 2003.

* cited by examiner

Primary Examiner—Carl J. Arbes
(74) Attorney, Agent, or Firm—Rader, Fishman & Grauer PLLC (57) ABSTRACT

A chip mounting device of the present invention includes: an adhesive application unit 11; a temporary crimp unit 12; and a main crimp unit 13. In the unit 11, a camera 21 is used for detecting base material marks for each section region on a film base material 1 and substrate marks for each substrate pattern in the section region. The detected results are transferred to the unit 12. In the unit 12, a camera 45 is used for detecting base material marks, and the position of each substrate pattern is recognized on the basis of on the detection results and the positional data of each substrate pattern transmitted from the unit 11, thereby crimping chips temporarily. This enables the chips to be mounted with high precision even when the film base material 1 is expanded and contracted. In the unit 12, there is no detection of substrate marks, which minimizes a decrease in processing efficiency.

21 Claims, 7 Drawing Sheets

CHIP MOUNTING DEVICE

TECHNICAL FIELD

The present invention relates to a device and method for mounting chips such as semiconductor devices or surface-mounting components on a base material to be processed on which a plurality of substrate patterns are drawn and, more particularly, to a technique of mounting chips with high precision by detecting and adjusting positional deviation between substrate patterns due to the expansion and contraction of the base material to be processed.

BACKGROUND ART

Figure 11:
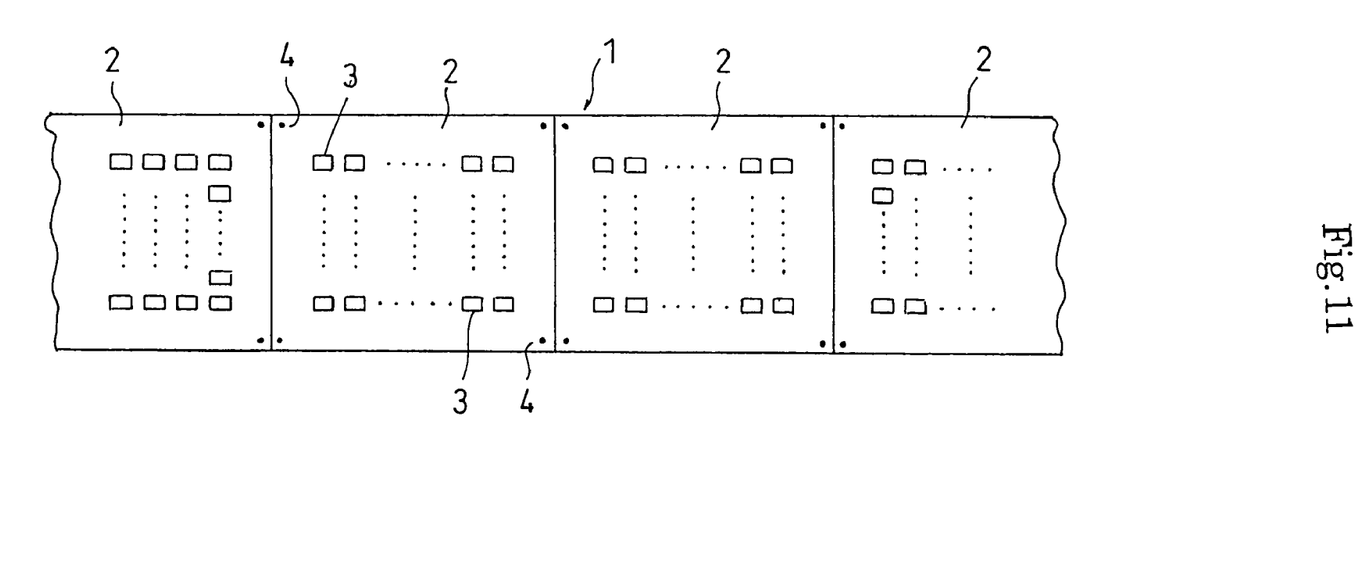
FIG. 11 is a view for describing a film base material used in a conventional device.

Conventionally, in a mounting process for IC cards or the like, a plastic film base material is used as the base material to be processed. The schematic structure of the film base material is shown in FIG. 11. FIG. 11 shows a plan view of part of the film base material. The film base material 1 is band-shaped and includes section regions 2 consecutive in its longitudinal direction, each of the section region 2 being a unit for a mounting process. Each of the section regions 2 includes substrate patterns 3 which are in a one-to-one correspondence with IC cards and which are printed at regular intervals in the longitudinal and lateral directions, and positioning marks 4 (hereinafter, referred to as "base material marks") which are printed at the four corners of each section region 2. The positional relationship between the substrate patterns 3 is determined relative to these base material marks 4. In the mounting process, the base material marks 4 are detected and used as the reference in recognizing the position of each substrate pattern 3 on the basis of the predetermined positional relationship, thereby mounting chips on each substrate pattern 3.

The mounting process for each section region 2 mainly involves an adhesive application process for applying adhesive to prescribed positions in the substrate patterns 3; a temporary crimp process for positioning chips on the positions where the adhesive has been applied and temporarily crimping the chips thereto; and a main crimp process for bonding the temporarily crimped chips to the base material. In some cases, chips are positioned on positions where the adhesive has been applied and directly bonded thereto without dividing between the temporary crimp process and the main crimp process. In any case, in each process, the base material marks 4 in the section regions 2 are firstly detected, and the position of each substrate pattern 3 is recognized by using the base material marks 4 as the reference, thereby applying the adhesive or crimping the chips.

However, the conventional example has the following problems.

Even when each substrate pattern 3 is printed with high precision relative to the base material marks 4 as reference, if the base material to be processed expands and contracts under the influence of temperature or humidity, error occurs in the positional relationship between the base substrate marks 4 and the substrate patterns 3, thereby deteriorating the precision of chip mounting. In particular, when the base material to be processed is the plastic film base material 1, this tendency becomes remarkable. The same problem causes when the substrate patterns 3 have printing error. In order to solve this problem, it is considered that the substrate patterns 3 are detected in each process; however, this would cause another problem that the tact time of the device is delayed.

In view of the circumstances, the present invention has an object of providing a device and method for mounting chips with high precision and at a high rate by detecting and adjusting positional deviation between substrate patterns due to the expansion and contraction of the base material to be processed.

DISCLOSURE OF THE INVENTION

A chip mounting method of the present invention comprises: an adhesive application step of applying adhesive to each of a plurality of substrate patterns drawn on a base material to be processed; and a crimp step of crimping chips on positions where the adhesive has been applied, wherein the adhesive application step detects a base material mark which is drawn in a prescribed position on the base material to be processed and a substrate mark which is drawn in a prescribed position in each substrate pattern, so as to find positional data of each substrate pattern relative to the base material mark as a reference, thereby providing the positional data to the crimp step, and the crimp step detects the base material mark of the base material to be processed and recognizes the position of each substrate pattern on the basis of the detected results and the positional data provided from the adhesive application step, thereby crimping chips onto each substrate pattern.

According to the chip mounting method of the present invention, when the adhesive is applied to the base material to be processed, the base material marks of the base material to be processed and the substrate marks of each substrate pattern are detected to find the positional data of each substrate pattern relative to the base material marks as a reference. The positional data are given to the subsequent crimp process. In the crimp process, the base material marks of the base material to be processed to which the adhesive has been applied are detected, and the position of each substrate pattern is recognized on the basis of the detection results and the positional data provided from the adhesive application process, thereby crimping the chips onto the substrate patterns. Since the position of each substrate pattern is recognized by using as the reference the base material marks of the base material to be processed and then the chips are mounted on the substrate patterns, even when the base material to be processed expands or contracts, the chips can be mounted with high precision on the substrate patterns. In addition, the base material marks and the substrate marks are detected in the adhesive application step which is performed comparatively quickly, that is, which has time to spare, and the base material marks are exclusively detected and the substrate marks are not detected in the crimp process by providing the positional data to the crimp step. This can reduce the tact time of the device as compared with the case where the positional data of each substrate pattern is collected in the crimp step. It can also minimize a decrease in process efficiency caused by the collection of the positional data.

A chip mounting device of the present invention comprises: an adhesive application unit for applying adhesive to each of a plurality of substrate patterns drawn on a base material to be processed; and a crimp unit for crimping chips onto positions where the adhesive has been applied, wherein the adhesive application unit includes: first base material mark detection means for detecting a base material mark which is drawn in a prescribed position on the base material to be processed; substrate mark detection means for detecting a substrate mark which is drawn in a prescribed position on each substrate pattern; positional data acquisition means for finding positional data of each substrate pattern relative to the base material mark as a reference from detection results of the preceding both detection means; and data provision means for providing the crimp unit with the positional data of each substrate pattern, the crimp unit includes: second base material mark detection means for detecting a base material mark of the base material to be processed; and crimp head drive control means for controlling horizontal transfer of a crimp head to a position according to each substrate pattern on the basis of the detection results of the second base material mark detection means and the positional data provided from the adhesive application unit, thereby crimping chips onto each substrate pattern.

According to the chip mounting device of the present invention, in the adhesive application unit, first base material mark detection means detects the base material marks of the base material to be processed, and the substrate mark detection means detects the substrate marks of the substrate patterns. On the basis of these detection results, positional data acquisition means finds the positional data of each substrate pattern relative to the base material marks as a reference. Data provision means provides the positional data to the crimp unit. In the crimp unit, second base material mark detection means again detects the base material marks of the base material to be processed which are transferred from the adhesive application unit. On the basis of the detection results and the positional data provided from the adhesive application unit, the crimp head drive control means controls the movement of the crimp heads to the position corresponding to each substrate pattern in the horizontal direction, thereby crimping the chips to the substrate patterns. This action of the device enables suitable execution of the chip mounting method of the present invention.

A preferable example of the chip mounting method and chip mounting device of the present invention is to include the base material marks drawn on a plurality of positions on the base material to be processed. The number of positions where the substrate material marks of the base material to be process are drawn is not particularly limited. For example, in the case where the base material marks are drawn on two positions of the base material to be processed, positioning is possible; however, in order to improve precision in detecting the base material marks and in mounting the chips, it is preferable that the base material marks are drawn on four positions in the four corners of the base material to be processed. The reason for this is that even when the base material is changed into a trapezoid or a parallelogram due to expansion or contraction, adjustment becomes possible by recognizing the four corners.

An example of the base material to be processed which is used for chip mounting devices is a band-shaped film base material transferred from a feed roll to a wind-up roll. The band-shaped film base material, which has a comparatively high degree of expansion and contraction, can mount chips thereon with high density. Another example of the base material to be processed is divided into section regions and a plurality of substrate patterns are arranged in each section region, and the base material to be processed is either one of a plastic base material, a resin base material and a glass base material.

Chips used in the chip mounting device preferably have elastic or plastic deformable bumps. The reason for this is that the bumps elastic deform or plastic deform at the time of crimping chips to lessen the impact of crimping. This can not only prevent the chips from being damaged by the impact but also increase the rate of lowering the crimp heads to improve processing efficiency.

The chip mounting device is preferably constituted as follows.

In the chip mounting device, the crimp unit includes storage means which stores height data from each position on the top surface of the holding table which holds the base material to be processed to the bottom surface of the crimp heads. When the chips are crimped onto the substrate patterns by lowering the crimp heads, the crimp head drive control means stops the lowering of the crimp heads when they reach a fixed height position from each position on the top surface of the holding table by referring to the height data of each position stored in the storage means so as to control positions to stop the lowering of the crimp heads from position to position on the top surface of the holding table.

According to the chip mounting device thus constituted, when the crimp heads are lowered to crimp the chips onto the substrate patterns, the height data from each position on the top surface of the holding table which holds the base material to be processed to the bottom surface of the crimp heads are referred to and, as a result, the crimp heads are stopped at the fixed height position in the respective position on the top surface of the holding table. Consequently, the position to stop the lowering of the crimp heads can be at a fixed height even with unevenness such as undulations or distortions on the top surface of the holding table, or even with undulations or distortions on the head transfer XY table. This can not only realize chip mounting without giving excessive impact on the chips or on the base material to be processed but also improve processing efficiency by increasing the rate of lowering the crimp heads.

BEST MODE FOR CARRYING OUT THE INVENTION

The following is a mode to solve the conventional problems.

Figure 1:
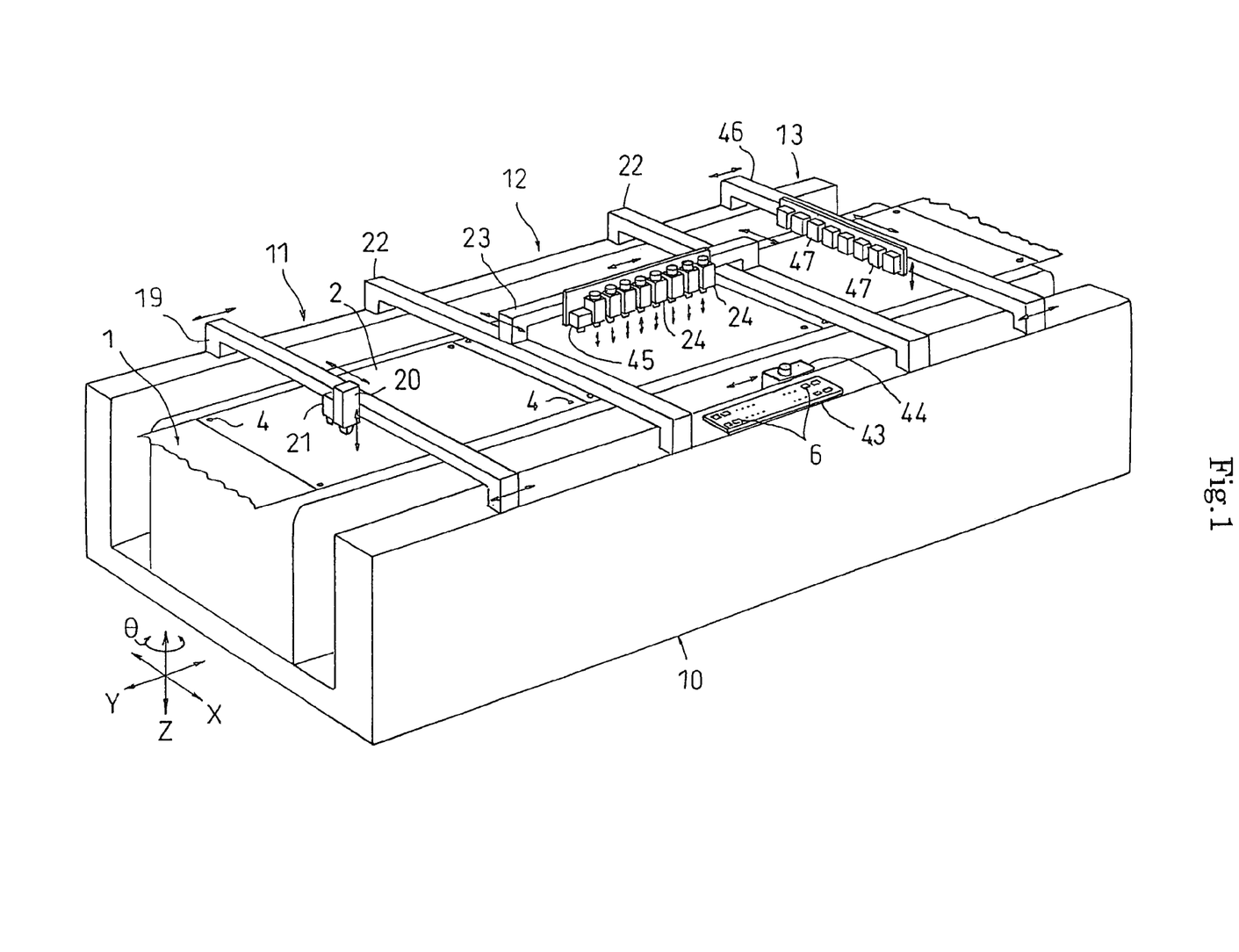
FIG. 1 is a perspective view schematically showing the entire structure of an embodiment of a chip mounting device of the present invention.
Figure 2:
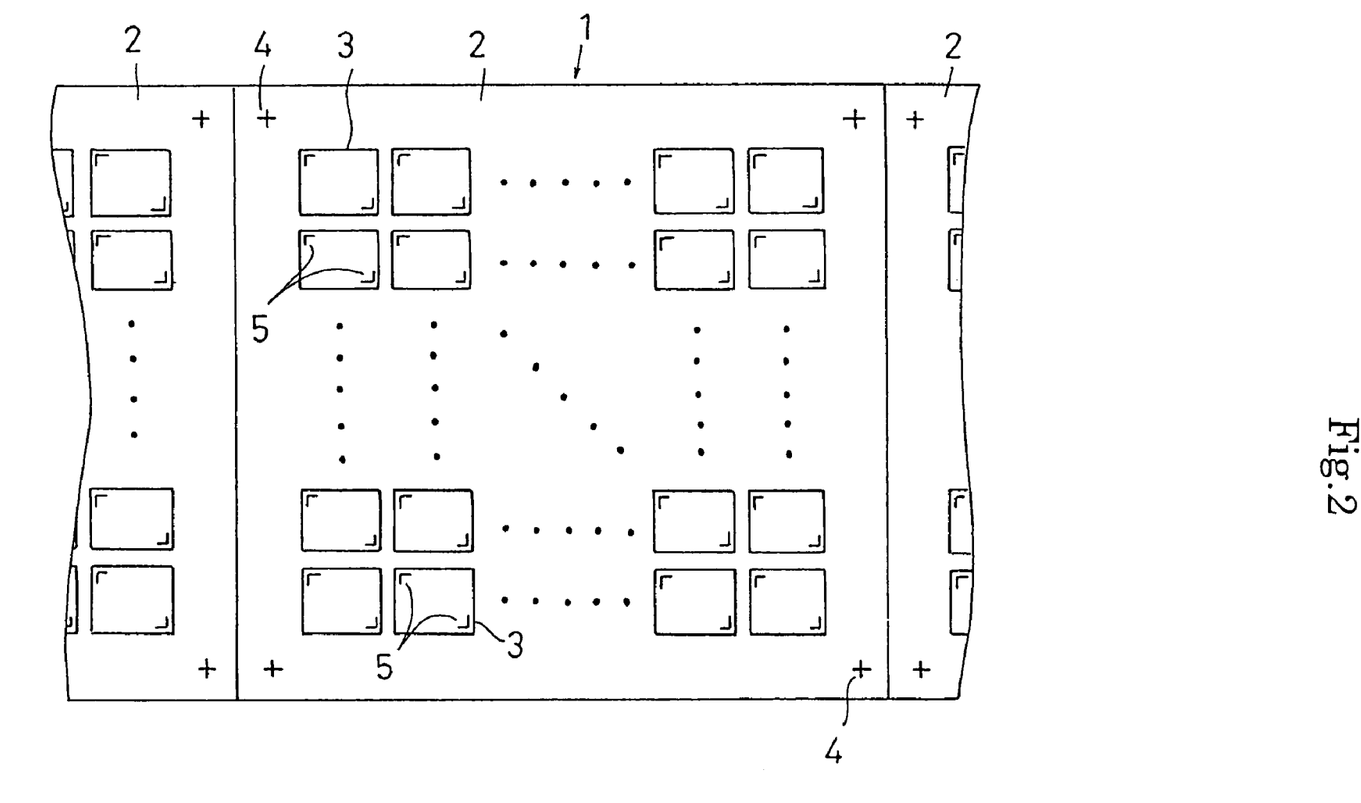
FIG. 2 is a plan view showing part of a film base material.
Figure 3:
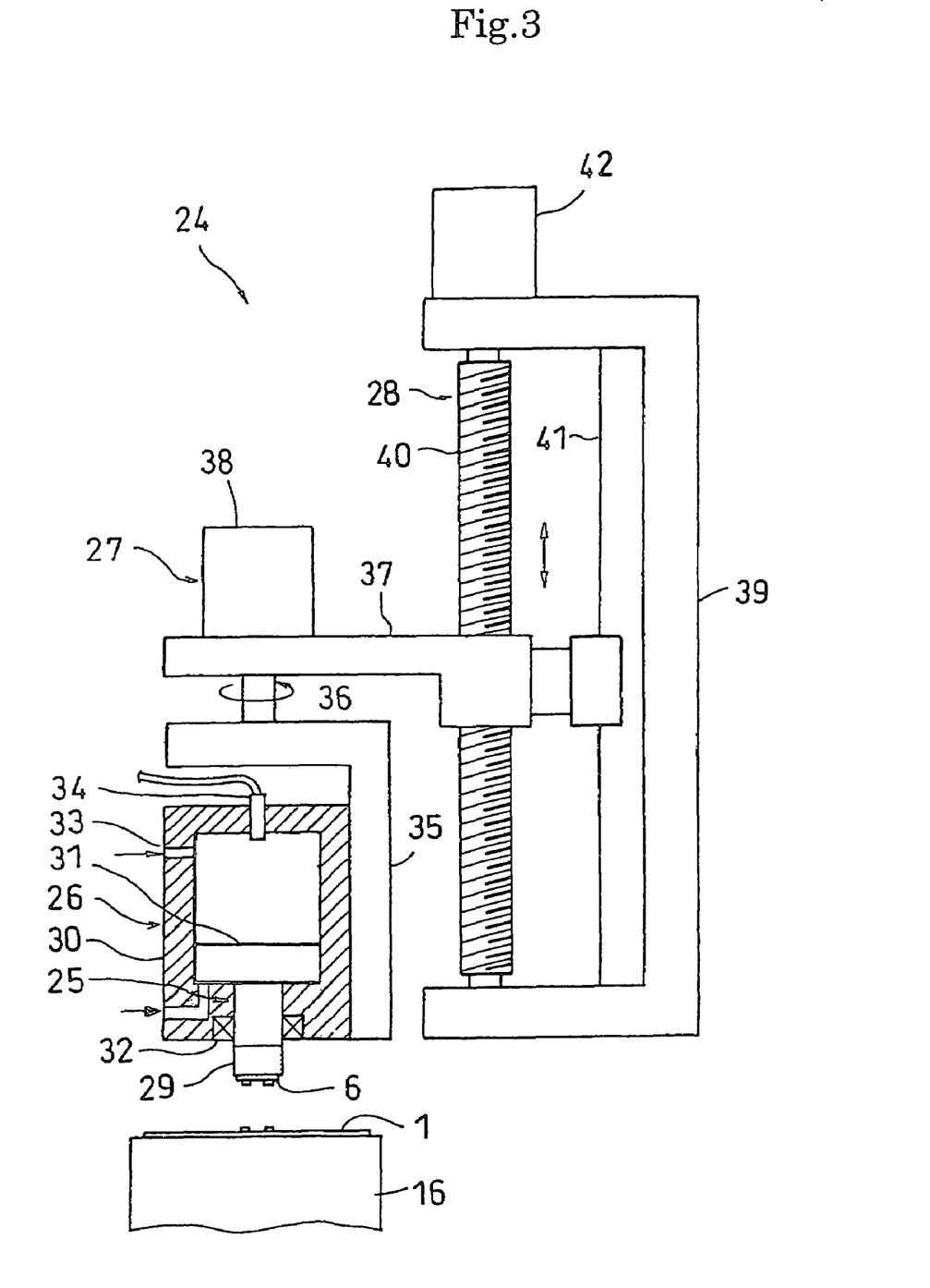
FIG. 3 is a schematic structure of a temporary crimp head.

An embodiment of the present invention will be described as follows with reference to the drawings. FIG. 1 is a perspective view schematically showing the entire structure of an embodiment of a chip mounting device of the present invention; FIG. 2 is a plan view showing part of a film base material; FIG. 3 is a side view partially cut of the schematic structure of a temporary crimp head; and FIG. 4 is a block diagram of a control system of the device of the example.

As shown in FIG. 1, the chip mounting device of the present embodiment is mainly comprises: a device base 10; an adhesive application unit 11 provided on one end (the left end side in FIG. 1) of the device base 10; a temporary crimp unit 12 provided adjacent to the adhesive application unit 11; and a main crimp unit 13 provided on the other end (the right end side in FIG. 1) of the device base 10.

Figure 4:
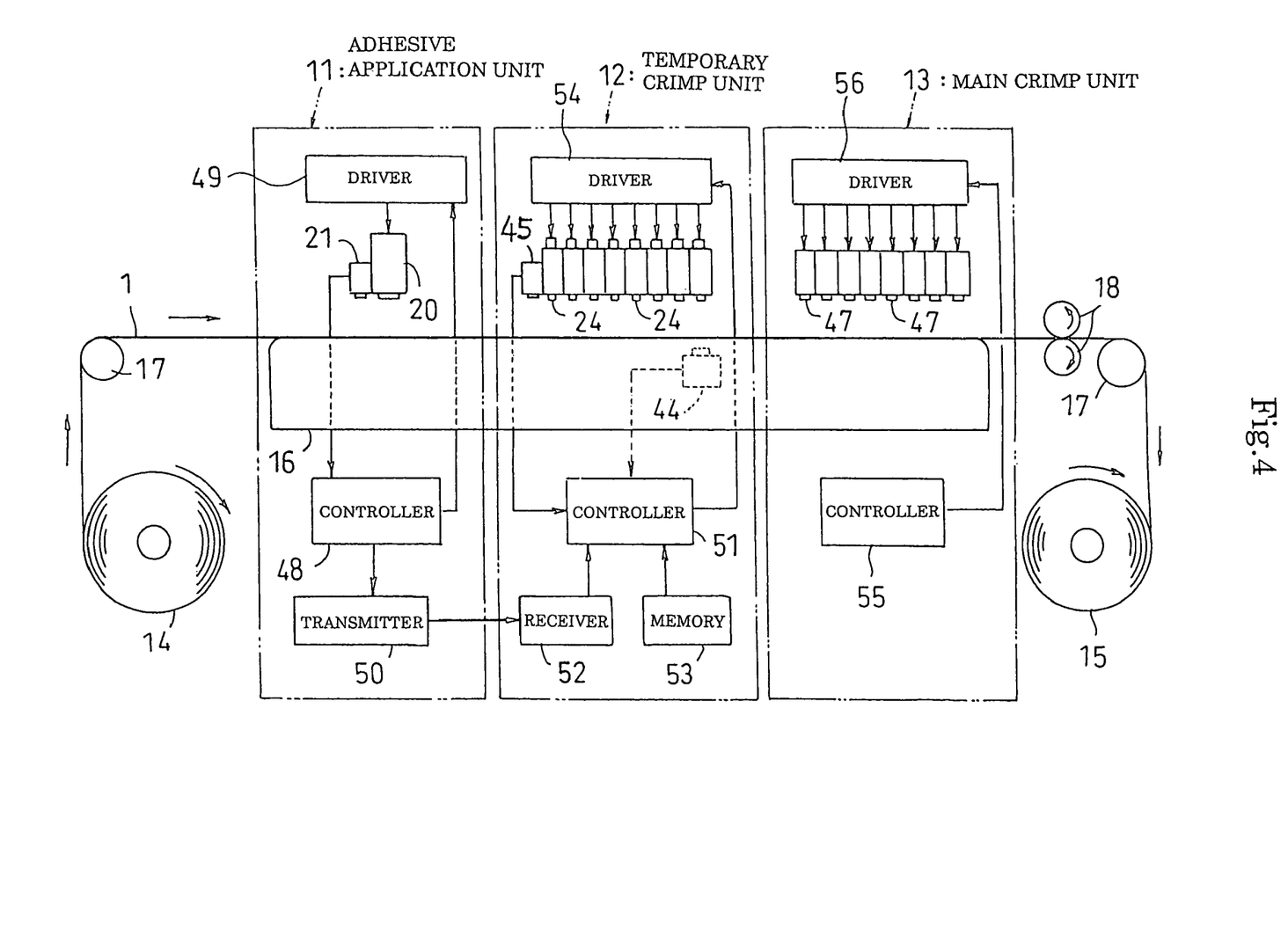
FIG. 4 is a control block diagram of a device of an example.

As shown in FIG. 4, the base material to be processed of the device of the present embodiment is a band-shaped film base material 1 carried from a feed roll 14 to a wind-up roll 15. The device base 10 contains a holding table 16 which supports the film base material 1 from below in its longitudinal direction. The holding table 16 includes a vacuum suction mechanism (not shown) which holds the film base material 1 by suction onto the table top surface at the respective positions of the units 11, 12 and 13. On the transfer route of the film base material 1 are provided a guide roller 17 for guiding the film base material 1, a drive roller 18 for transferring the film base material 1 by holding it from top and bottom, and the like. Alternatively, it is possible to adopt grip feed manner in which a film is gripped and fed straight.

As shown in FIG. 2, the film base material 1 includes section regions 2 consecutive in its longitudinal direction, each section region 2 being a unit for processing in the device of the present embodiment. In each section region 2, substrate patterns 3 are printed at regular intervals in the longitudinal and lateral directions in such a manner as to be in a one-to-one correspondence with IC cards, for example. In the present embodiment, eight substrate patterns 3 are printed both in the longitudinal direction and in the lateral direction in each section region 2. Of course, the arrangement and number of the substrate patterns 3 are arbitrary without being limited to those in the embodiment. The positioning marks 4 (base material marks) are printed on the four corners of each section region 2, and positioning marks (substrate marks) 5 are printed on the two diagonal corners of each substrate pattern 3. The shapes, arranging positions, and numbers of the base material marks 4 and the substrate marks 5 can be determined arbitrarily without being limited to those in the embodiment.

As shown in FIG. 1, the adhesive application unit 11 includes a movable arm 19 which is spanned across the width of the device base 10 (direction X) so as to move in the longitudinal direction (direction Y) of the device base 10. The movable arm 19 is provided with an adhesive application head 20 which applies adhesive to each substrate pattern 3 on the film base material 1, and a mark detecting camera 21 for detecting the base material marks 4 on the film base material 1 and the substrate marks 5 on each substrate pattern 3. The adhesive application head 20 and the mark detecting camera 21 integrally move across the movable arm 19 in the direction X. An unillustrated moving mechanism to operate the movable arm 19 and the adhesive application head 20 is constituted by a well-known screw feed mechanism driven by a servo motor. The spacing between the adhesive application head 20 and the mark detecting camera 21, which is adjustable, is set in the present embodiment to the pitch at which the substrate patterns 3 are arranged in the direction X. Alternatively, a plurality of adhesive application heads 20 may be arranged in accordance with the pitch of the substrate patterns 3, so as to realize concurrent adhesive application with these heads, thereby improving processing efficiency of the adhesive application unit 11.

The adhesive application head 20 is free to go up or down to apply adhesive to the chip mounting positions in each substrate pattern 3. The adhesive is selected, in accordance with the mounting method, from a conductive paste or film, an insulating paste or film, underfil, flux, and the like. In the present embodiment, the adhesive is applied in such a manner as to slightly rise on the base material.

The mark detecting camera 21 can be a CCD camera, and is used for the detection of both the base material marks 4 and the substrate marks 5. Therefore, the mark detecting camera 21 corresponds to first base material mark detection means and substrate mark detection means of the device of the present invention. It is of course possible to use a plurality of mark detecting cameras to detect the base material marks 4 and the substrate marks 5 separately.

The mark detecting cameras 21 can be any kind besides a CCD camera, as long as it can recognize the base material marks 4 and the substrate marks 5, such as an infrared camera, an X-ray camera or a sensor.

The temporary crimp unit 12 is constituted as follows.

A pair of fixed arms 22 facing each other are spanned across the width of the device base 10 (direction X), and a movable arm 23 is provided across these fixed arms 22 in such a manner as to be movable in the direction X. The movable arm 23 includes eight temporary crimp heads 24 integrally arranged so as to be movable in the direction Y. An unillustrated moving mechanism to operate the movable arm 23 and the temporary crimp heads 24 is driven by a servo motor. The moving mechanism may be a screw feed, a belt feed, a linear servo or any other mechanism. The spacing between the temporary crimp heads 24, which is adjustable, is set in the present embodiment to the pitch at which the substrate patterns 3 are arranged in the direction Y. The temporary crimp heads 24 correspond to the crimp heads of the present invention.

Structure of the temporary crimp heads 24 will be described as follows with reference to FIG. 3.

The temporary crimp heads 24 each includes: a chip holding tool 25 which holds by suction a chip 6 which is a mounting component such as an IC chip; a pressure control mechanism 26 which lets a pressure applied on the tool 25 escape when the pressure exceeds a predetermined value; a rotation mechanism 27 which rotates or displaces the chip holding tool 25 within the horizontal plane; and a height control mechanism 28 which controls the height of the chip holding tool 25.

The chip holding tool 25 includes a mechanism for holding by suction the chip 6 onto a tool head 29 at the bottom of the tool 25, and a mechanism for heating the chip 6. The holding structure for the chip 6 is not limited to a suction type, and can be any such as mechanical holding with a movable hook, static suction with static electricity, or magnetic suction with a magnet. In some cases where the viscosity of adhesive is used for temporary crimp, heating is unnecessary.

The pressure control mechanism 26 is constituted by an air cylinder mechanism including an air cylinder tube 30 and a piston 31 inserted into the tube 30, and the chip holding tool 25 is connected to the bottom end of the piston 31. The piston 31 is supported by the vertical straight bearing 32 so as to be movable only in the vertical direction. The air cylinder tube 30 has a pressurizing port 33 open in the upper portion of the tube 30, and pressurized air having a constant pressure is supplied through the pressurizing port 33. The air cylinder tube 30 also has a sensor 34 attached on its top end. When the temporary crimp head 24 is given a strong impact such as in the case where another chip 6 is mistakenly crimped on the chip 6, the piston 31 escapes upwards so as to prevent the temporary crimp head 24 from being damaged and also to detect such an abnormal condition by the sensor 34. The air cylinder is formed from a spring in some cases.

The rotation mechanism 27 is constituted as follows. The air cylinder tube 30 is fixedly supported by a bracket 35, and the bracket 35 is supported by a slider 37 in a rotatable manner via a rotation axis 36 in the vertical direction. The rotation axis 36 is connected with the output axis of a serve motor 38 attached to the slider 37. Controlling the driving of the servo motor 38 enables the chip holding tool 25 to rotate or displace freely within the horizontal plane.

The height control mechanism 28 is constituted as follows. The base end of the slider 37 is helically connected with a helical axis 40 supported by a frame 39 so as to be rotatable in the vertical direction, and is also engaged with a guide rail 41 arranged parallel to the helical axis 40 so as to be guided in the vertical direction. The helical axis 40 is connected to the output axis of the servo motor 42 attached to the top end of the frame 39. Controlling the driving of the servo motor 42 enables the chip holding tool 25 to move in the vertical direction. In the case of a plurality of heads, it is possible to make the plurality of heads rotate concurrently in the direction θ by using a connection belt and move concurrently in the direction Z by the Z axis, thereby supplying air on the cylinder pressurizing side of only a selected head, whereas supplying air on the cylinder bottom side of the other heads so as to float the heads. In this case, the number of axes can be also reduced.

Again in FIG. 1, a chip tray 43 on which a great number of chips 6 are arranged is provided on one side of the X-direction transfer route of the group of temporary crimp heads 24. Besides using the tray, the chips can be supplied by being stuck on a self-adhesive tape and using a supply reel or by being mounted on a wafer, raising chip by chip, and flipping the electrode side downwards to arrange the chips. In the vicinity of the chip tray 43 is provided a chip mark detecting camera 44 to be movable in the direction Y for detecting chip marks of the chips 6 held by suction onto the group of temporary crimp heads 24. The detection of the chip marks of the chips 6 by the camera 44 can find the amount of positional deviation of the chips 6 held by the temporary crimp heads 24, and the amount of positional deviation is adjusted by moving the temporary crimp heads 24 in the directions X, Y and θ. It is also possible to detect chip marks by fixing the chip mark detecting camera 44 and moving the group of temporary crimp heads 24. Moving both the chip mark detecting camera 44 and the group of temporary crimp heads 24 is preferable to reduce the tact time.

Detecting the chip marks by using a plurality of chip mark detecting cameras 44 can further reduce the tact time. The chip mark detecting camera 44 corresponds to chip mark detecting means of the present invention.

Similar to the mark detecting camera 21, the chip mark detecting camera 44 can be any kind besides a CCD camera, as long as it can recognize the base material marks 4, such as an infrared camera, an X-ray camera or a sensor.

The temporary crimp unit 12 further includes a base material mark detecting camera 45 which moves in the directions X and Y together with the aforementioned group of temporary crimp heads 24. This camera 45 detects the base material marks 4 in the section regions 2 of the film base material 1 transferred by the temporary crimp unit 12 and finds the amount of positional deviation of each section region 2 on the basis of the detection results. The base material mark detecting camera 45 corresponds to second base material mark detection means in the device of the present invention. It is preferable to fix a plurality of base material mark detecting cameras 45 on the fixed arm 22 or the like and to detect the base substrate marks 4, in order to improve the tact time of the device.

Similar to the case of the mark detecting camera 21 and the chip mark detecting camera 44, the base material mark detecting camera 45 may be any kind besides a CCD camera, as long as it can recognize the base material marks 4, such as an infrared camera, an X-ray camera or a sensor.

The main crimp unit 13 includes a movable arm 46 which is spanned across the width of the device base 10 (direction X) so as to move in the longitudinal direction (direction Y) of the device base 10. The movable arm 46 is provided with eight main crimp heads 47 collectively arranged to be movable in the direction X and the direction Z (vertical). An unillustrated moving mechanism to operate the movable arm 46 and the main crimp heads 47 is driven by a servo motor. The moving mechanism may be a screw feed, a belt feed, a linear servo or any other mechanism. The spacing between the main crimp heads 47, which is adjustable, is set in the present embodiment to the pitch at which the substrate patterns 3 are arranged in the direction X. In the present embodiment, the group of temporary crimp heads 24 and the group of main crimp heads 47 are arranged orthogonally to each other; however, they may be arranged in the same direction. The main crimp unit 13 is appropriately constituted according to the bonding manner of the chips 6; for example, it may be a reflow furnace or omitted.

Operation of the chip mounting device with the aforementioned structure will be described with reference to the drawings including the control block diagram of FIG. 4.

The film base material 1 is pitch fed at the pitch at which the section regions 2 are arranged. When the first section region 2 is carried to the adhesive application unit 11, the section region 2 is held by suction onto the holding table 16. Next, the mark detecting camera 21 moves in the directions X and Y integrally with the adhesive application head 20, so as to detect the base material marks 4 in the section region 2 and the substrate marks 5 in each substrate pattern 3. The detection results of each of the base material marks 4 and the substrate marks 5 are transferred to a controller 48 of the adhesive application unit 11. On the basis of the detection results, the controller 48 finds the positional data of each substrate pattern 3 by using the base material marks 4 as the reference. The controller 48 corresponds to positional data acquisition means in the device of the present invention.

The controller 48 drives the adhesive application head 20 via a driver 49 every time a substrate mark 5 of each substrate pattern 3 is detected. Consequently, the adhesive is applied to the predetermined mounting positions in the substrate patterns 3. When all the substrate patterns 3 in the section region 2 are applied with the adhesive, the film base material 1 is pitch fed to forward the section region 2 with the adhesive to the temporary crimp unit 12. In synchronization with the transfer of the film base material 1, the controller 48 transmits the positional data of each substrate pattern 3 relative to the base material marks 4 as the reference to the temporary crimp unit 12 via a transmitter 50. The transmitter 50 corresponds to data provision means of the present invention.

When positional recognition of each substrate pattern 3 in the section region 2 is finished (or before the positional recognition), the group of temporary crimp heads 24 moves towards a chip tray 43, and hold by suction the chips 6 onto the bottom surfaces of the respective tool heads 29. Holding by suction the chips 6, the group of temporary crimp heads 24 moves up to a position above the chip mark detecting camera 44 and stops. Next, the camera 44 moves in the direction Y, detects the chip marks of the chips 6 held by suction onto the bottom surfaces of the respective tool heads 29, and transmits the detection results to the controller 51. On the basis of the detection results, the controller 51 recognizes the positions of the chips 6 held by suction on the tool heads 29. At the time of temporarily crimping the chips 6 described later, the positional deviation between positions of the chips 6 and positions to mount the chips 6 thereon is adjusted by positioning the chip holding tools 25 in the directions X, Y and θ via the driver 54.

When the detection of the positions of the chips 6 is finished, the group of temporary crimp heads 24 moves in the horizontal direction above the substrate patterns 3. Then, after the chip holding tool 25 of the first temporary crimp head 24 (e.g., the leftmost one in FIG. 1) is positioned in the directions X, Y and θ, the chip holding tool 25 is lowered to temporarily crimp the chip 6 onto the first substrate pattern 3. Next, the chip holding tool 25 of the second temporary crimp head 24 is positioned in the same manner so as to temporarily crimp the chip 6 onto the second substrate pattern 3. The temporary crimp heads 24 are thus driven sequentially to temporarily crimp the chips 6.

Although the operation of the temporary crimp unit 12 is thus described, the device of the present embodiment also performs characteristic operations. The temporary crimp unit 12 temporarily crimps the chips 6 after positioning the group of the heads 24, which takes longer to process every section region 2 than the other units 11 and 13. Therefore, there is a demand to speed up the moving operation of the individual temporary crimp heads 24 so as to improve processing efficiency. However, to speed up lowering the chip holding tools 25 increases the impact when the chips 6 come into contact with the substrate patterns 3, thereby causing the problem of breaking the bumps of the chips 6 excessively.

In addition, it is not easy to flatten in a wide range the surface of the holding table 16 which has been produced and installed so as to have as flat a surface as possible, which causes slight unevenness within the section region 2. In such a case, lowering the chip holding tools 25 of the temporary crimp heads 24 in a uniform stroke movement causes some chips 6 to hit the substrate patterns 3 so strong as to break the bumps excessively in some positions, whereas the other chips 6 to break the bumps insufficiently in other positions in a section region 2. Either case causes bonding failure of the bumps. The same problem occurs when the temporary crimp heads 24 are installed differently from each other in height.

The device of the present embodiment adopts the following structure in order to solve the aforementioned problems. First, the structure of the chips to be crimped temporarily will be described as follows.

The chips 6 used in the present embodiment have elastic or plastic deformable bumps 6a. A so-called polymer bump made from conductive paste or the like is preferable as the elastic or plastic deformable bumps 6a. However, even soldered bumps, stud bumps, plated bumps and the like can be used by adopting appropriate conditions such as less hardness or less area, because by doing so, they can be put in an elastic or plastic deformable condition.

Figure 5:
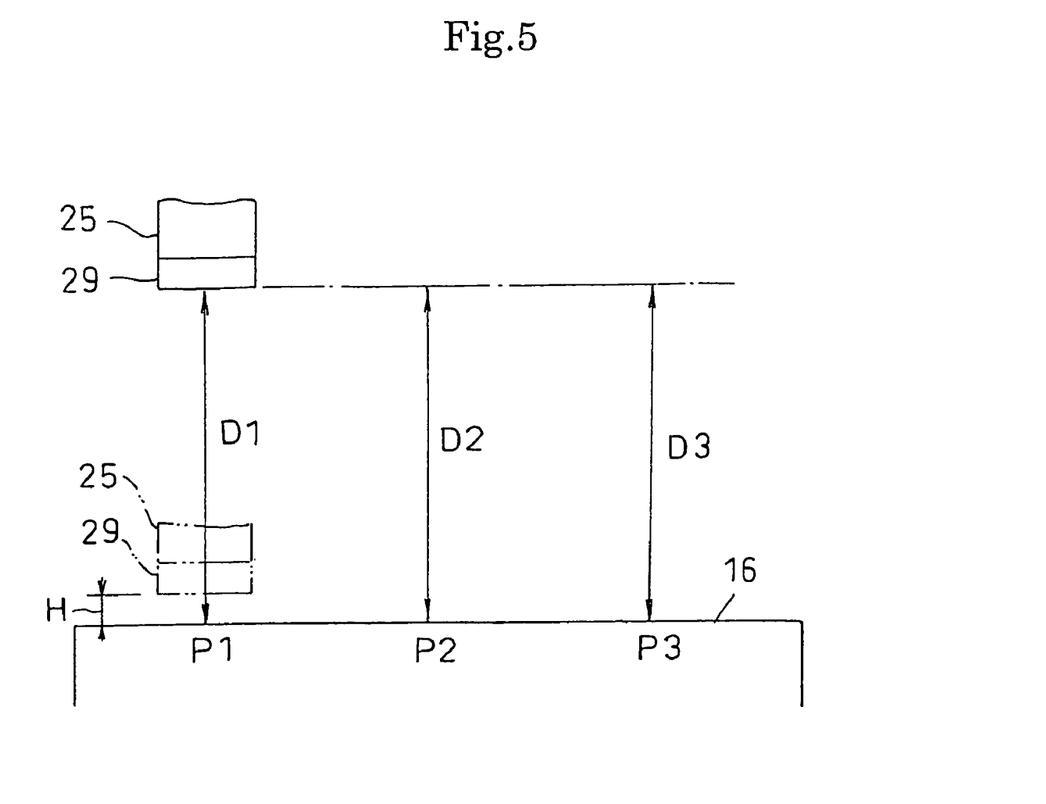
FIG. 5 is a view for describing height data corresponding to each position on a holding table.
Figure 6:
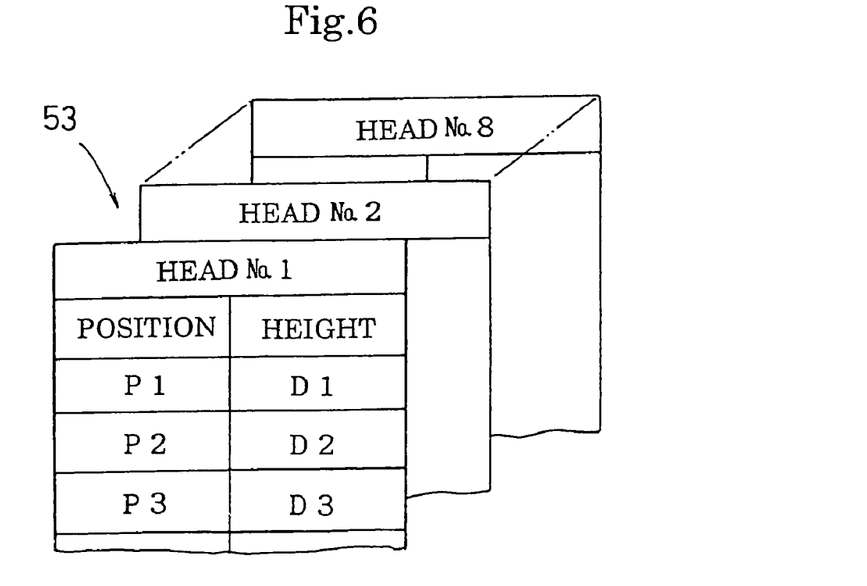
FIG. 6 is a schematic diagram of a memory where the height data of FIG. 5 are stored.

The problems related to the variation in the height of the top surface of the holding table 16 and the variation in the height of installing the temporary crimp heads 24 are intended to be solved by the following structure. The solution will be described as follows with reference to FIGS. 5 and 6. As shown in FIG. 5, the distances between the positions P1, P2, P3 . . . on the top surface of the holding table 16 where the substrate patterns 3 are placed and the bottom surfaces of the tool heads 29 of the temporary crimp heads 24 are previously measured. The height data D1, D2, D3 . . . of the positions P1, P2, P3 . . . corresponding to the respective temporary crimp heads 24 are obtained and stored in a memory 53 provided in the temporary crimp unit 12 (See FIGS. 4 and 6).

In order to crimp the chips 6 temporarily by sequentially lowering the chip holding tools 25 of the temporary crimp heads 24, the controller 51 of the temporary crimp unit 12 refers to the memory 53 and read the height data of each position in the substrate patterns 3, thereby controlling the positions to stop lowering the chip holding tools 25. To be more specific, as shown in FIG. 5, when temporary crimping is made on the position P1, the chip holding tool 25 is lowered as much as corresponding to "D1–H" so as to stop at a fixed height H from the top surface of the holding table 16. In the same manner, when temporary crimping is made on the position P2, the tool 25 is lowered by the distance corresponding to "D2–H". Thus controlling the mount of lowering the chip holding tools 25 for each position makes it possible to stop the chip holding tools 25 at the same height from the top surface of the holding table 16. Consequently, the bumps of the chips 6 can be prevented from being broken excessively due to error in the degree of flatness of the holding table 16, error in the height of installing the temporary crimp heads 24, and undulations or distortions of the head transfer XY table.

FIGS. 7 to 10 show the processes of temporary crimping of the chips 6 in the present embodiment. The following is a detailed description of the temporary crimp process in the temporary crimp unit 12 with reference to these drawings.

Figure 7:
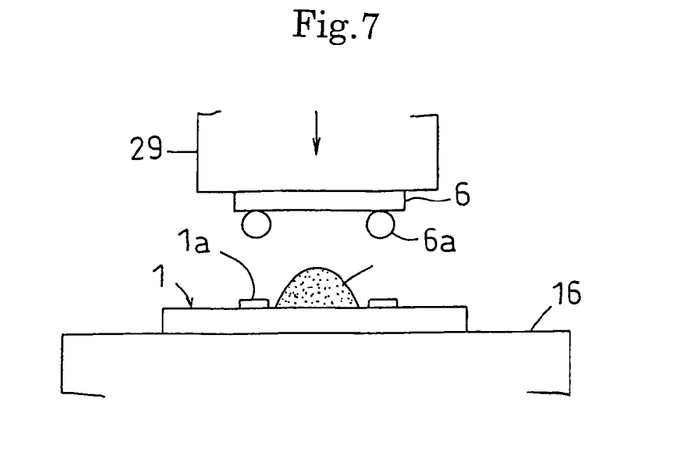
FIG. 7 is a view for describing a temporary crimp process.

In FIGS. 7 to 10, reference numeral 1a represents an electrode formed in each substrate pattern 3 on the film base material 1, and reference numeral 7 represents adhesive applied by the adhesive application unit 11. The adhesive can be made from a resin called NCP, for example. First, as shown in FIG. 7, the chip 6 including the elastic or plastic deformable bumps 6a is lowered while being held by suction onto the tool head 29. This lowering operation is performed by the height control mechanism 28 shown in FIG. 3.

Figure 8:
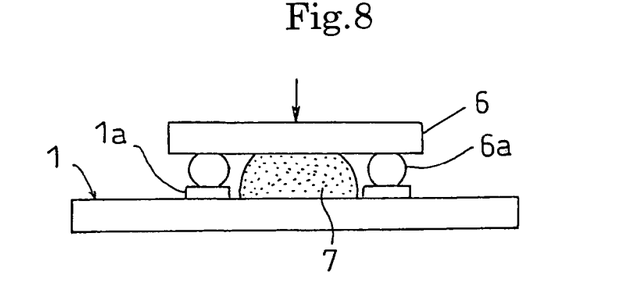
FIG. 8 is a view for describing a temporary crimp process.
Figure 9:
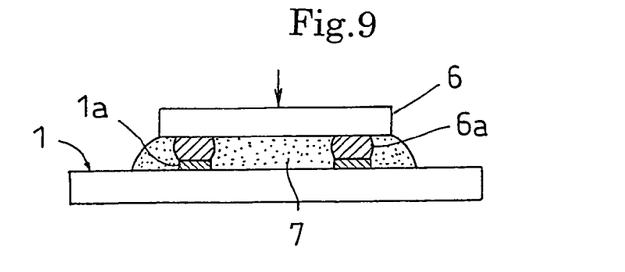
FIG. 9 is a view for describing a temporary crimp process.

When the chip 6 comes into contact with the surface of the film base material 1, as shown in FIGS. 8 and 9, the bumps 6a of the chip 6 deform elastically or plastically, and absorb the impact given to the chip 6, thereby preventing the chip 6 from being under too much pressure. After the aforementioned height control is performed, height error in each chip is absorbed by deformation of the bumps. While the chip 6 is pressed onto the film base material 1, the adhesive 7 spreads in the horizontal direction, thereby filling the space between the chip 6 and the film base material 1.

Figure 10:
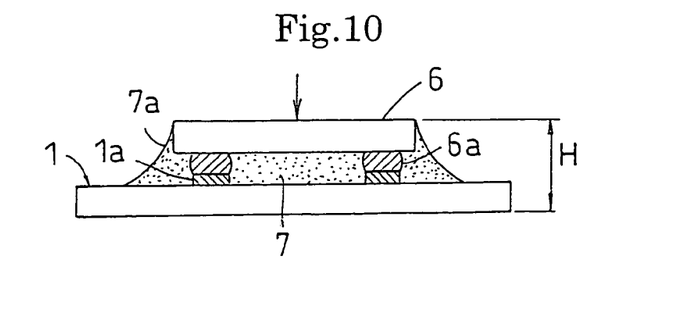
FIG. 10 is a view for describing a temporary crimp process.

When the chip 6 is further pressed until it reaches the predetermined stop position H of the chip holding tool 25, as shown in FIG. 10 the adhesive 7 sticks out from the side surfaces of the chip 6 to form a filet 7a. Formation of the filet 7a enables the chip 6 to be fixed to the film base material 1 more firmly.

When the chips 6 are thus temporarily crimped onto each substrate pattern 3 in the section region 2, the film base material 1 is pitch fed to transfer the section region 2 to the main crimp unit 13 in the next stage. In the main crimp unit 13, a controller 55 makes a driver 56 drive the eight main crimp heads 47 at the same time. To be more specific, the group of main crimp heads 47 is lowered concurrently to main crimp the chips 6 every eight substrate patterns 3. The chips 6 in each substrate pattern 3 are applied with heat and pressure by the main crimp heads 47, thereby hardening the adhesive 7, and realizing sufficient electric connection between the bumps 6a and the electrode 1a. The main crimp unit 13 does not require high-precision positioning, so that the group of main crimp heads 47 is moved in the directions X and Y in accordance with the prescribed pitch at which the substrate patterns 3 are arranged. Alternatively, the base material marks 4 may be detected in the same manner as in the temporary crimp unit 12 so as to adjust positional deviation of the film base material 1.

While the main crimp unit 13 performs main crimping of the chips 6, the temporary crimp unit 12 performs temporary crimping of the chips 6 in the next section region 2, and the adhesive application unit 11 performs application of the adhesive 7 to the next section region 2. In this manner, the units 11, 12 and 13 concurrently perform the respective processes to the section regions 2.

As described above, according to the device of the present embodiment, the chips 6 are crimped by recognizing the position of each substrate pattern 3, which enables the chips 6 to be mounted with high precision even on a base material which expands and contracts comparatively greatly under the influence of temperature and humidity like the plastic film base material 1. Since the position recognition of each substrate pattern 3 is performed in the adhesive application unit 11 with high processing efficiency, the processing efficiency of the temporary crimp unit 12 is never decreased by the positional recognition of the substrate patterns 3, thereby minimizing a decrease in the tact time of the chip mounting device. In addition, the use of the chips 6 having the elastic or plastic deformable bumps 6a, and the control of the stopping positions of the chip holding tools 25 of the temporary crimp heads 24 in accordance with the variation in the degree of flatness of the holding table 16 can prevent the bumps 6a from being deformed excessively, thereby enabling the chips 6 to be mounted with high quality.

The present invention can be modified as follows, without being limited to the aforementioned embodiment.

(1) In the aforementioned embodiment, the band-shaped film base material 1 is used as a base material to be processed; however, the base material to be processed is not limited thereto, and it is possible to use a plastic base material or a glass base material which is divided into a plurality of section regions where a plurality of substrate patterns are drawn. In addition, the number or arrangement of the substrate patterns in the section regions are arbitrary. For example, when eight-gang heads are used as in the temporary crimp unit 12 and the main crimp unit 13 in the present example, 16 or 24 substrate patterns can be arranged in the longitudinal and lateral directions at regular intervals. Although the number of heads in each unit is of course arbitrary, when a plurality of heads are provided, it is preferable to set the number of substrate patterns in the section regions according to the number of heads in order to improve processing efficiency.

(2) In the aforementioned embodiment, the units 11, 12 and 13 have the controllers 48, 51 and 55, respectively; however, these units 11, 12 and 13 may also be controlled by a single controller. In this case, the positional data of each substrate pattern 3 obtained in the adhesive application unit 11 are temporarily stored in the memory installed in the single controller. Then, in synchronization with the transfer of a section region 2 with the adhesive from the adhesive application unit 11 to the temporary crimp unit 12, the positional data of each substrate pattern 3 are transferred to the work area for the temporary crimp unit in the same memory. The temporary crimp unit 12 recognizes the position of each substrate pattern 3 on the basis of the transferred positional data. Alternatively, it is possible that the positional data of each substrate pattern are stored in a specific region in the memory that the units share, and the specific region is accessed by the controller 51 of the temporary crimp unit 12 so as to acquire the positional data of each substrate pattern. In this case, there is no transfer of positional data. It is also possible to connect the individual control devices to a host computer which manages the lines for data management. The data provision means in the present invention includes the data transfer in the memory as mentioned above and the access to a specific region in the memory shared by the units.

(3) In the aforementioned embodiment, one crimp unit is divided into the two units of the temporary crimp unit 12 and the main crimp unit 13 to improve processing efficiency; however, it is possible that a single crimp unit performs from the positioning of the chips to the main crimp.

(4) The structures of the units 11, 12 and 13 can be modified if necessary. For example, the adhesive application unit 11 can be provided with a plurality of adhesive application heads 20. Furthermore, in the main crimp unit 13, the group of main crimp heads 47 is driven concurrently; however, it is possible to perform individual parallel transfer control or individual rotation control for each of the main crimp heads 47 and to lower each of the crimp heads 47 on an individual basis for main crimping.

(5) In the aforementioned embodiment, the pressure control mechanism 26 of the temporary crimp heads 24 is constituted by an air cylinder mechanism. Alternatively, it can be constituted by a spring mechanism in which the chip holding tools 25 are supported by an elastic member such as a compressed coil spring so as to lessen the impact given to the chips 6 when the chips 6 come into contact with the film base material 1.

(6) In the aforementioned embodiment, chips are mounted by being heated, which is a so-called chip bonding; however, this is not the only method available. For example, chips can be mounted without being heated.

INDUSTRIAL APPLICABILITY

As described above, the chip mounting method and chip mounting device of the present invention is suitable for mounting chips, such as semiconductor devices or surface-mounting components onto a base material to be processed which is likely to expand and contract.

What is claimed is:

1. A chip mounting device comprising: an adhesive application unit for applying adhesive to each of a plurality of substrate patterns drawn on a base material to be processed; and a crimp unit for crimping chips onto positions where the adhesive has been applied, wherein the adhesive application unit includes: first base material mark detection means for detecting a base material mark which is drawn in a prescribed position on the base material to be processed; substrate mark detection means for detecting a substrate mark which is drawn in a prescribed position on each substrate pattern; positional data acquisition means for finding positional data of each substrate pattern relative to the base material mark as a reference from detection results of the preceding both detection means; and data provision means for providing the crimp unit with the positional data of each substrate pattern, the crimp unit includes: second base material mark detection means for detecting a base material mark of the base material to be processed; and crimp head drive control means for controlling horizontal transfer of a crimp head to a position according to each substrate pattern on the basis of the detection results of the second base material mark detection means and the positional data provided from the adhesive application unit, thereby crimping chips onto each substrate pattern.

2. The chip mounting device according to claim 1, wherein
there are the plurality of base material marks drawn in the plurality of positions on the base material to be processed.

3. The chip mounting device according to claim 2, wherein
the base material marks are drawn on four positions at four corners on the base material to be processed.

4. The chip mounting device according to claim 1, wherein
the base material to be processed is a band-shaped film base material which is transferred from a feed roll to a wind-up roll.

5. The chip mounting device according to claim 1, wherein
the plurality of substrate patterns are arranged in each section region, and the base material to be processed is one of a plastic base material, a resin base material and a glass base material divided into the plurality of section regions.

6. The chip mounting device according to any of claims 1 to 5 wherein
as the chips, chips having elastic or plastic deformable bumps are used.

7. The chip mounting device according to any of claims 1 to 5, wherein
the crimp unit includes storage means which stores height data from each position on the top surface of a holding table which holds the base material to be processed up to the bottom surface of the crimp head, and
at the time of crimping chips onto each substrate pattern by lowering the crimp head, the crimp head drive control means stops lowering the crimp head when the crimp head reaches a fixed height position from each position on the top surface of the holding table by referring to the height data of each position stored in the storage means so as to control the stopping of lowering the crimp head from position to position on the top surface of the holding table.

8. The chip mounting device according to any of claims 1 to 5, wherein
the first base material mark detection means and the substrate mark detection means are combined in function, and combined detection means detects the base material marks and the substrate marks.

9. The chip mounting device according to any of claims 1 to 5 wherein
the crimp unit includes chip mark detection means for detecting a chip mark which is drawn on a prescribed position in each of the chips.

10. The chip mounting device according to claim 9, wherein
the crimp unit includes a group of crimp heads which hold respective chips and crimp the chips onto positions where the adhesive has been applied, and the chip mark detection means and the group of crimp heads are configured in such a manner that the chip mark detection means detects the chip marks of the chips held by the group of crimp heads by moving at least one of the chip mark detection means or the group of crimp heads.

11. The chip mounting device according to any of claims 1 to 5 wherein
the adhesive application unit includes a plurality of adhesive application heads for applying the adhesive to each substrate pattern on the base material to be processed in accordance with each substrate pattern, and the plurality of adhesive application heads concurrently apply the adhesive to each substrate pattern.

12. The chip mounting device according to claim 6, wherein
the crimp unit includes storage means which stores height data from each position on the top surface of a holding table which holds the base material to be processed up to the bottom surface of the crimp head, and
at the time of crimping chips onto each substrate pattern by lowering the crimp head, the crimp head drive control means stops lowering the crimp head when the crimp head reaches a fixed height position from each position on the top surface of the holding table by referring to the height data of each position stored in the storage means so as to control the stopping of lowering the crimp head from position to position on the top surface of the holding table.

13. The chip mounting device according to claim 6, wherein
the first base material mark detection means and the substrate mark detection means are combined in function, and combined detection means detects the base material marks and the substrate marks.

14. The chip mounting device according to claim 7, wherein
the first base material mark detection means and the substrate mark detection means are combined in function, and combined detection means detects the base material marks and the substrate marks.

15. The chip mounting device according to claim 6 wherein
the crimp unit includes chip mark detection means for detecting a chip mark which is drawn on a prescribed position in each of the chips.

16. The chip mounting device according to claim 7 wherein
the crimp unit includes chip mark detection means for detecting a chip mark which is drawn on a prescribed position in each of the chips.

17. The chip mounting device according to claim 8, wherein
the crimp unit includes chip mark detection means for detecting a chip mark which is drawn on a prescribed position in each of the chips.

18. The chip mounting device according to claim 6, wherein
the adhesive application unit includes a plurality of adhesive application heads for applying the adhesive to each substrate pattern on the base material to be processed in accordance with each substrate pattern, and the plurality of adhesive application heads concurrently apply the adhesive to each substrate pattern.

19. The chip mounting device according to claim 7, wherein
the adhesive application unit includes a plurality of adhesive application heads for applying the adhesive to each substrate pattern on the base material to be processed in accordance with each substrate pattern, and the plurality of adhesive application heads concurrently apply the adhesive to each substrate pattern.

20. The chip mounting device according to claim 8, wherein the adhesive application unit includes a plurality of adhesive application heads for applying the adhesive to each substrate pattern on the base material to be processed in accordance with each substrate pattern, and the plurality of adhesive application heads concurrently apply the adhesive to each substrate pattern.

21. The chip mounting device according to claim 9, wherein the adhesive application unit includes a plurality of adhesive application heads for applying the adhesive to each substrate pattern on the base material to be processed in accordance with each substrate pattern, and the plurality of adhesive application heads concurrently apply the adhesive to each substrate pattern.

* * * * *